United States Patent
Kosugi

[19]

[11] Patent Number: 5,963,697
[45] Date of Patent: Oct. 5, 1999

[54] SEMICONDUCTOR LASER MODULE

[75] Inventor: Tomonari Kosugi, Tokyo, Japan

[73] Assignee: NEC Corporation, Tokyo, Japan

[21] Appl. No.: 09/023,985

[22] Filed: Feb. 13, 1998

[30] Foreign Application Priority Data

Feb. 13, 1997 [JP] Japan .................................. 9-044756

[51] Int. Cl.[6] .................................................. G02B 6/36
[52] U.S. Cl. .................................. 385/93; 385/92; 385/88
[58] Field of Search ........................... 385/88–94; 372/36

[56] References Cited

U.S. PATENT DOCUMENTS 5,068,865  11/1991  Ohshima et al. ........................ 372/36

FOREIGN PATENT DOCUMENTS

| 0 259 018 | 3/1988 | European Pat. Off. . |
| 0111392 | 4/1989 | Japan . |
| 2-29536 | 2/1990 | Japan . |
| 5-150146 | 6/1993 | Japan . |
| 5-241048 | 9/1993 | Japan . |
| 8-152542 | 6/1996 | Japan . |
| 10-022581 | 1/1998 | Japan . |

*Primary Examiner*—Phan T. H. Palmer
*Attorney, Agent, or Firm*—Scully, Scott, Murphy & Presser

[57] ABSTRACT

A semiconductor laser module comprising a module package, a temperature control device, the lower plate of which is fixed to the inner bottom of the module package, a base plate fixed to the upper plate of the temperature control device, a semiconductor laser attached on the base plate for emitting laser light, an optical fiber fixed through the side wall of the module package, and a lens fixed on the base plate for optically connecting the semiconductor laser and the optical fiber. An upper plate of the temperature control device is fitted and fixed in a recess which is formed in the bottom of the base plate such that all side surfaces of the upper plate are in contact with all side surfaces of the recess. A lower plate of the temperature control device is fitted and fixed in a recess formed in the inner bottom of the module package.

4 Claims, 2 Drawing Sheets

SEMICONDUCTOR LASER MODULE

BACKGROUND OF THE INVENTION

1. Field of the Invention

The present invention relates to a semiconductor laser module suitable for use in optical communication systems or in optical information processing systems, and particularly relates to a semiconductor laser module for optically connecting an optical fiber with a laser beam emitted from a semiconductor laser, the temperature of which is controlled by an electronic temperature control device.

This application is based on Patent Application No. Hei 9-044756 filed in Japan, the content of which is incorporated herein by reference.

2. Background Art

A semiconductor laser module is widely used as a signal light source in various optical fiber transmission systems. High reliability is required in these optical communication systems; hence the semiconductor laser module used in these systems is required to provide high reliability for long periods.

FIG. 2 shows a structure of a conventional semiconductor laser module described in Japanese Patent Application, First Publication, No. Hei 5-150146. FIG. 2A shows the side view, and FIG. 2B shows the front view of a conventional laser module.

Referring to FIGS. 2A and 2B, the conventional semiconductor laser module 10 is encapsulated in an module package 11, and an end portion of an optical fiber 12 for transmitting the light signal is fixed by YAG (Yttrium Aluminium Garnet) laser welding through a side wall 11F of the module package 11. A groove 11M is formed in the inner bottom 11B of the module package 11 in a direction parallel to the laser-light axis and an electronic cooling device 13 is fixed by soldering in the groove 11M. An electronic cooling device 13 is composed of a plurality of unit cooling elements 13M held in between an upper insulating plate 13U and a lower insulating plate 13D, and a plurality of unit cooling elements is connected and fixed by soldering with a thin-film or thick-film metal conductor patterns formed on both inner surfaces of the upper and lower insulating plate. A base plate 14 is provided with perpendicular lateral edge portions 14a and 14b at both side edges which are arranged in a direction parallel to the light axis, and the base plate 14 is attached by soldering on the upper insulating plate 13U of the electronic cooling device 13. A support plate 14S on which the semiconductor laser 15 is mounted is attached on the top surface of the base plate 14 by soldering. A lens 16 is mounted on the base plate 14 by YAG laser welding for optically connecting the light beam emitted from the semiconductor laser with the optical fiber.

However, the conventional semiconductor laser module illustrated in FIG. 2 has a problem in that it does not have a long-term reliability, because optical components such as the semiconductor laser and the lens are displaced by creeping of soldered portions and consequently these optical components forming the light axis from the semiconductor laser to the optical fiber through the lens become misaligned with the original light axis. The reasons of displacements will be described below.

As shown in FIGS. 2A and 2B, in the conventional semiconductor laser module 10, an end portion of the optical fiber 12 is fixed by YAG laser welding through the side wall 11F of the module package 11. The electronic cooling device 13 is mounted by soldering on the inner bottom surface 11B of the module package 11. A base plate 14 is attached on the top surface of the upper plate of the electronic cooling device 13 by soldering. The semiconductor laser 15 is mounted by soldering on the top surface of the base plate 14, and the lens 16 is also mounted by YAG laser welding on the base plate 14.

The lens 16 is located for aligning its light axis with the direction of the laser beam emitted from the semiconductor laser 15 such that the semiconductor laser is optically connected with the optical fiber 12. The optical fiber 12 is located at the same height as that of the light emitting portion of the semiconductor laser 15.

In the above conventional semiconductor laser module 10, the long-term reliability is deteriorated by creeping of soldered portions, such as, portions between the base plate 14 and the electronic cooling device 13, and between the electronic cooling device 13 and the module package. When creeping occurs, the base plate 14 or the electronic cooling device 13 is displaced, and the semiconductor laser 15 and the lens 16 mounted on the base plate 14 are displaced from their original positions on the light axis between the semiconductor laser 15 and the optical fiber 12 through the lens 16.

However, owing to perpendicular lateral portions 14a and 14b of the base plate 14, it is possible to avoid displacements of the base plate 14 as well as the semiconductor laser 15 and the lens 16 from their original positions as far as in a direction orthogonal to the light axis.

Similarly, the groove 11M formed in a parallel direction to the light axis formed in the inner bottom 11B of the module package 11 may prevent the soldered portion between the module package 11 and the lower plate 13B of the electronic cooling device 13 from being displaced as far as in a direction orthogonal to the light axis.

However, it is not possible for the conventional semiconductor laser module to be prevented from being displaced in the direction parallel to the light axis.

Furthermore, in the case when the module package is mounted in an system vertically, namely, in the direction parallel to the direction of gravity, the weight of both base plate and electronic cooling device is applied directly to the soldered portions. In such an arrangement, soldered portions may be more liable to creep than if the module package 11 were arranged horizontally.

As described above, long-term reliability therefore cannot be expected for the conventional semiconductor laser module.

SUMMARY OF THE INVENTION

In view of the above problems, the present invention is directed to accomplish the object of providing a semiconductor laser module which has a high long term reliability by preventing creeping of soldered portions as well as optical components in both directions parallel and orthogonal to the light axis When displacements of soldered portions between the base plate and the upper plate of the electronic cooling device and between the lower plate of the electronic cooling parts and the module package can be avoided, optical components such as the semiconductor laser and the lens can be maintained at their original positions such that the light axis from the semiconductor laser to the optical fiber through the lens can be maintained as the original light axis.

The present invention also has the object of offering a semiconductor laser module which has a high long-term reliability by adopting a particular design for fixing the base plate with the electronic cooling device as well as for fixing the electronic cooling device with the module package. Such design makes it possible to avoid creeping of soldered portions and enables arranging the laser module in any direction, such as, horizontal or vertical directions.

In order to attain the above objectives, the present invention offers a semiconductor laser module comprising a module package; a temperature control device, the lower plate of which is fixed with a inner bottom of the module package; a base plate fixed with the upper plate of the temperature control device; a support plate attached on the upper insulating plate of the temperature control device; a semiconductor laser mounted on the support plate for emitting laser light; an optical fiber, the end of which is fixed through the side wall at a position where the laser light is incident; and a lens optically connecting the semiconductor laser and the optical fiber; wherein displacements of the base plate and the electric cooling device from predetermined positions are avoided by fitting and fixing the lower plate and the upper plate of the temperature control device into recesses formed in the inner bottom of the module package and in the bottom of the lower surface of the base plate, respectively.

A semiconductor laser module of the present invention is characterized in mutual fitting structures between the inner bottom surface of the module package and the lower plate of the temperature control device, as well as between the bottom surface of the base plate and the upper plate of the temperature control device.

A semiconductor laser module of the present invention is further characterized in a recess formed in either one of the inner bottom of the module package or the bottom of the lower plate of the electronic cooling device, and a recess formed in either one of the bottom of the base plate or the top of the upper insulating plate of the temperature control device for mutual fitting for fitting and fix the others in these recesses.

DESCRIPTION OF PREFERRED
EMBODIMENTS OF THE INVENTION

A semiconductor laser module of the present invention will be described in detail hereinafter according to the description of a preferred embodiment, referring to the attached drawings.

Figure 1A:
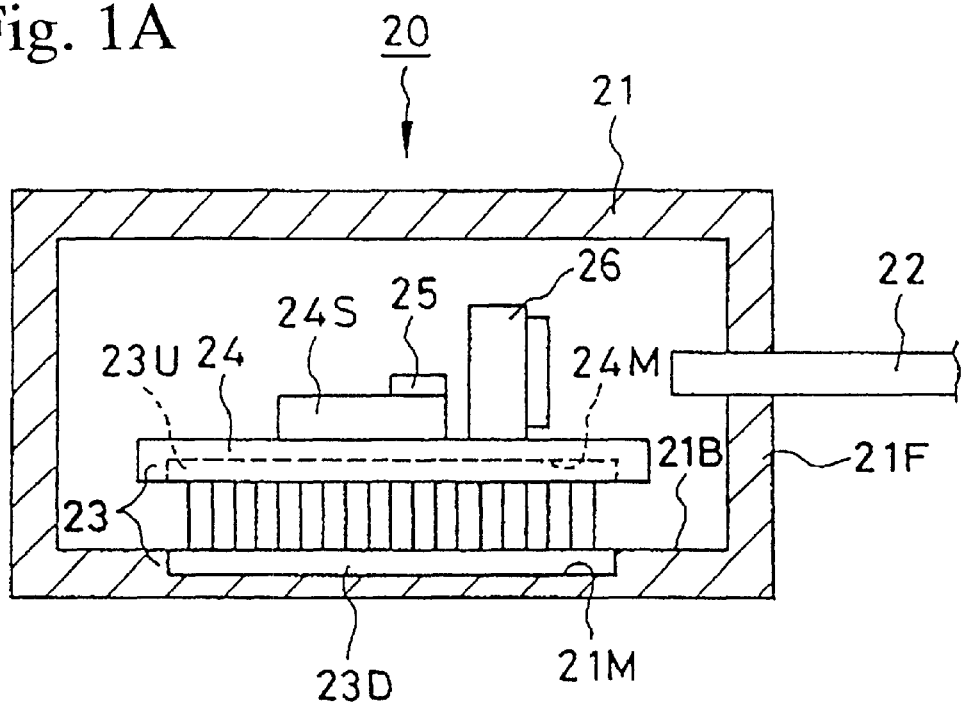
FIG. 1A is a side view of a semiconductor laser module of the present invention.
Figure 1B:
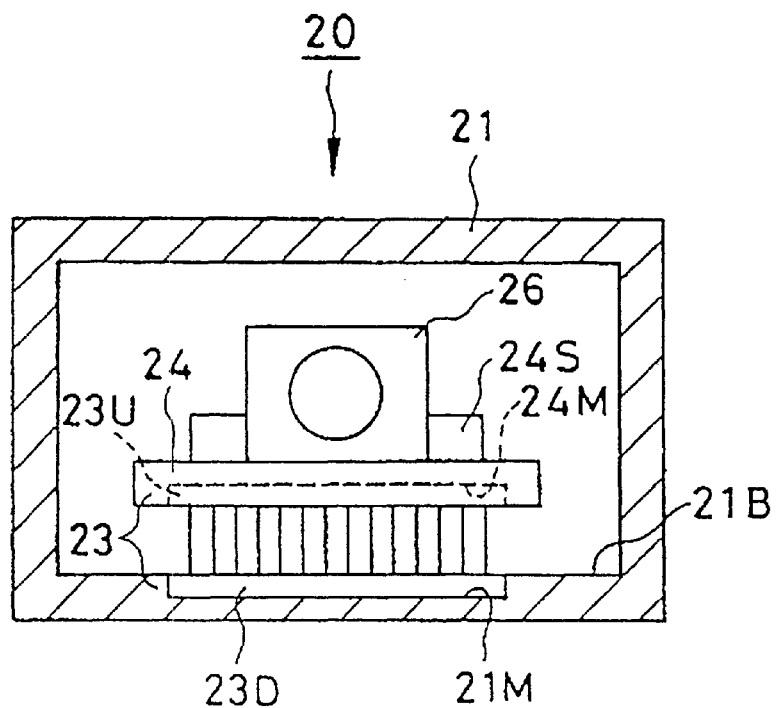
FIG. 1B is a front view of a semiconductor laser module of the present invention.
Figure 2A:
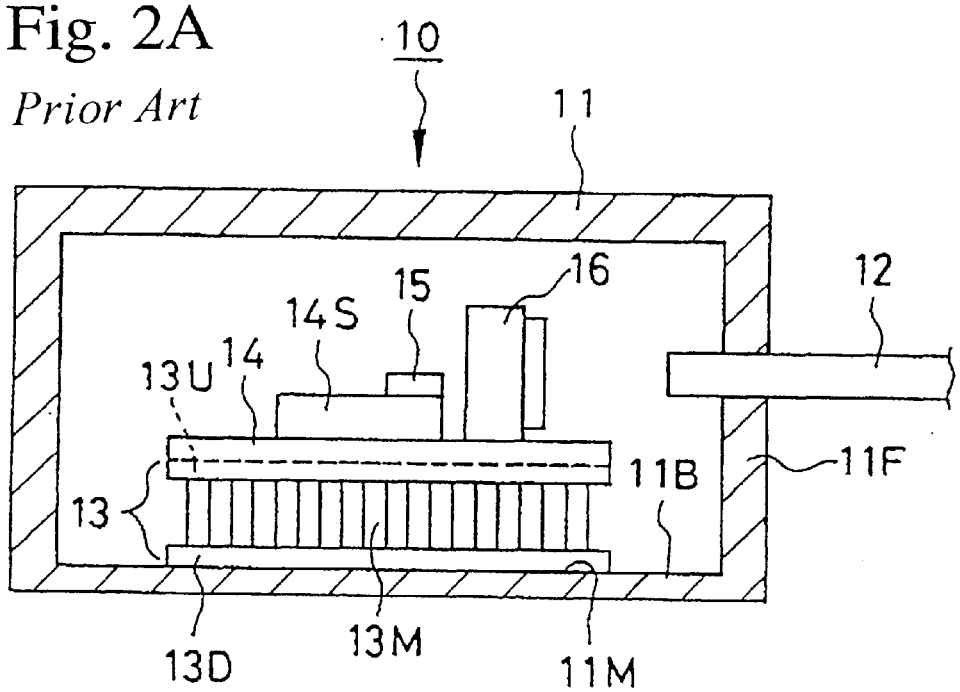
FIG. 2A is a side view of a conventional reduced-size semiconductor laser module.
Figure 2B:
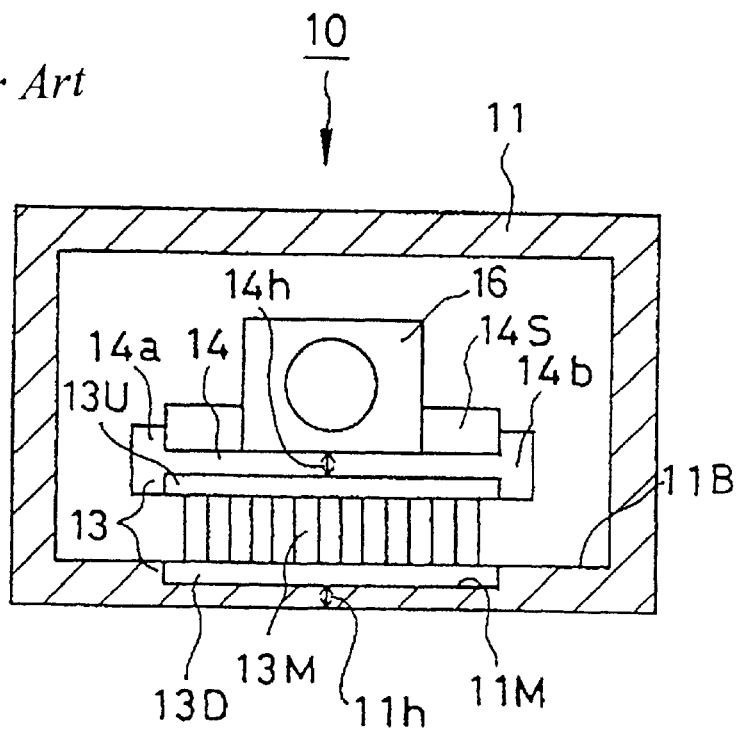
FIG. 2B is a front view of a conventional reduced-size semiconductor laser module.

As illustrated in FIGS. 1A and 1B, a semiconductor laser module of the present invention comprises a module package 21; a temperature control device 23, the lower plate 23D of which is fixed by soldering after being fitted in a recess 21M formed in the inner bottom of the module package 21 such that all side surfaces of the lower plates 23D are in contact with all side surfaces of the recess; a base plate which is fixed by soldering after being fitted in the upper plate 23U of the temperature control device 23 into a recess 24M formed in the bottom of the base plate; a support plate 24S fixed by soldering on the base plate 24; a semiconductor laser 25 fixed by soldering on the support plate for emitting laser light; an optical fiber 22, an end portion of which is fixed through the side wall 21F of the module package 21 at a position where the laser light is incident; a lens 26 fixed by YAG laser welding on the base plate for optically connecting the semiconductor laser and the optical fiber.

As shown above, in a preferred embodiment of the present invention, a recess 24M which is configured to fit with the upper plate 23U of the temperature control device 23 made of electronic components is formed in the bottom of the base plate 24. Thus, the base plate 24 can be fixed by soldering on the upper plate of the temperature control device after fitting the upper plate 23U of the temperature control device 23 into the recess 24M such that all side surfaces of the upper plate 23U are in contact with all side surfaces of the recess 24M. In the inner bottom of the module package 21, a recess is formed which matches with the lower plate 23D of the temperature control device 23. Thus, the temperature control device can be fixed by soldering with the module package after the lower plate 23D is fitted into the recess in the bottom of the module package such that all side surfaces of the lower plate 23D are in contact with all side surfaces of the recess. High long-term reliability is obtained by incorporating such fitting structure in the semiconductor laser module. Such fitting structure can suppress the displacements of the optical components, such as the semiconductor laser and the lens, by avoiding displacement of the fixed portions between the bottom surface of the base plate 24 and the upper plate 23U of the temperature control device 23, and between the inner bottom surface of the module package 21 and the lower plate 23D of the temperature control device 23.

According to an embodiment of the present invention, the semiconductor laser module 20 may be provided with a recess formed in either one of the inner bottom of the module package 21 or the bottom of the lower plate of the temperature control device 23 to fit and fix together, and a recess may be formed in either one of the bottom of the base plate 24 and the upper plate of the temperature control device 23 to allow fitting and fixing together.

A preferred embodiment will be described in more detail hereinafter, referring to drawings.

FIG. 1A is a side view of the semiconductor laser module of the present invention and FIG. 1B is a front view thereof.

As shown in FIGS. 1A and 1B, a semiconductor laser 20 of the present invention is provided with an optical fiber 22 for transmitting the light signals, the end portion of which is fixed by YAG laser welding through a side wall 21F of the module package 21. In the inner bottom of the module package, a recess is formed, in which the lower plate of the temperature control device, which comprises Peltier elements, is fitted such that all side surfaces of the lower plate are in contact with all inside surfaces of the recess and then fixed by soldering. The support plate 24S is fixed by soldering on the top surface of the base plate 24, and the semiconductor laser 25 is fixed by soldering on the top surface of the support plate 14.

A lens 26 for optically connecting the laser beam emitted from the semiconductor laser 25 with the optical laser 22 is fixed on the base plate 24 by YAG laser welding. The light axis of the lens 26 is aligned to be in line with the laser beam emitted from the semiconductor laser 25. The optical fiber 22 is fixed at the same height as that of the active layer or the laser emitting layer of the semiconductor laser 25.

In the present semiconductor laser module, the semiconductor laser 25 and the optical fiber 26 is optically connected by the lens 26. Furthermore, the temperature of the semiconductor laser 25 is maintained at a predetermined temperature by means of the electronic cooling device 23 which absorbs heat generated by the semiconductor laser through the support plate 24S and the base plate 24.

Since the base plate 24 has the recess 24M formed in its bottom side, and the recess is configured to be able to be fitted with four side surfaces of the upper plate of the electronic cooling device, the base plate can be fixed by soldering to the upper plate 23U of the electronic cooling device 23 after fitting the four side surfaces of the upper plate into four side surfaces of the recess, respectively.

A recess 21M, configured to fit with the upper plate of the temperature control device 23, is formed in the bottom of the module package 21, and the lower plate 21D of the temperature device 23 is fixed by soldering after the upper plate 21D is fitted into the recess 21M such that all side surfaces of the upper plate 21D are in contact with all side surfaces of the recess 21M.

As described above, the semiconductor laser module of the present invention comprises a base plate, the bottom side of which is not flat and is provided with a rectangular recess configured to fit with the size of the top surface of the upper plate of the electronic cooling device, and the base plate and the upper plate of the electronic cooling device can be fixed by soldering after the upper plate is fitted into the recess such that all surfaces of the plate are in contact with all surfaces of the recess; a module package, provided with a recess configured to be fitted to the size of the lower plate of the electronic cooling device and the lower plate is fixed by soldering to the module package after fitting the lower plate into the recess such that all side surfaces of the lower plate are in contact with all surfaces of the lower plate. High long-term reliability was achieved by such structure and by avoiding the displacement of the light axis caused by the creeping of the soldered portions between the bottom surface of the base plate and the upper plate of the electronic cooling device, and between the lower plate of the electronic cooling device and the inner bottom surface of the module package.

Furthermore, a semiconductor laser module of the present invention possesses long-term reliability which is not affected by orientation of the module in a transmission system. That is, the long-term reliability of this laser module is not affected irrespective of the loading directions, whether the module is mounted horizontally or vertically.

What is claimed is:

1. A semiconductor module comprising:

a module package;

a temperature control device, a lower plate of which is fixed in an inner bottom of said module package;

a base plate fixed on an upper plate of said temperature control device;

a support plate fixed on a top plate of said base plate;

a semiconductor laser fixed on the top surface of said support plate for emitting laser light;

an optical fiber, one end of which is fixed through the side wall at a point where the laser light is incident; and a lens for optically connecting said semiconductor laser and said optical fiber;

wherein a first recess is formed in the inner bottom of the module package to engage and to fix the lower plate of said temperature control device, and a second recess is formed in the bottom of the base plate to engage and to fix the upper plate of said electronic cooling device such that the displacements of the semiconductor laser and the lens are avoided in both parallel and orthogonal directions to the light axis of the laser light from the semiconductor laser to the optical fiber via the lens.

2. A semiconductor laser module according to claim 1, wherein the inner bottom surface of the module package and the lower plate of the temperature control device are fixed together after fitting the lower plate into a first recess formed in the bottom of the module package, and the base plate and the upper plate of the temperature control device are fixed together after fitting the upper plate of the temperature control device into a second recess formed in the bottom of the base plate.

3. A semiconductor laser module according to claim 1, wherein one of the inner bottom of the module package and the bottom of the base plate is provided with a recess to be fitted with the other, and one of the bottom of the base plate and the top surface of the upper plate of the electronic cooling device is provided with a recess to be fitted with the other.

4. A semiconductor laser module comprising:

a module package;

a temperature control device comprising electronic cooling elements, the lower plate of which is fixed with the inner bottom surface of said module package;

a base plate fixed with the upper plate of said electronic cooling device;

a support plate fixed on the top surface of said base plate;

a semiconductor laser fixed on the top surface of said support plate for emitting laser light;

an optical fiber fixed through the side wall of said module package at a position where the laser light is incident; and a lens for optically connecting said semiconductor laser fixed on said support plate with said optical fiber;

wherein the module package is provided with a first recess at the inner bottom configured to be fitted to the lower plate of the electronic cooling device, and the lower plate of the electronic cooling device is fitted into the first recess of the module package such that all side surface of the lower plate are in contact with all side surfaces of the first recess; and said base plate is provided with a second recess at the bottom configured to be fitted with the upper plate of said electronic cooling plate, and the upper plate of said electronic cooling device is fixed with the base plate after fitting the upper plate into the second recess such that all side surfaces of the upper plate are in contact with all side surfaces of the second recess.

* * * * *